United States Patent [19]
Nakamura

[11] Patent Number: 6,084,482
[45] Date of Patent: Jul. 4, 2000

[54] OSCILLATORY CIRCUIT HAVING BUILT-IN TEST CIRCUIT FOR CHECKING OSCILLATING SIGNAL FOR DUTY FACTOR

[75] Inventor: Kazuya Nakamura, Kanagawa, Japan

[73] Assignee: NEC Corporation, Tokyo, Japan

[21] Appl. No.: 09/176,325

[22] Filed: Oct. 22, 1998

[30] Foreign Application Priority Data

Oct. 24, 1997 [JP] Japan ................................. 9-292818

[51] Int. Cl.[7] ............................................. H03B 5/20
[52] U.S. Cl. ........................... 331/44; 331/74; 327/175; 324/76.39; 324/763; 324/711
[58] Field of Search ......................... 331/111, 74, 108 C, 331/175, 44; 327/175; 324/76.39, 676, 678, 711, 763

[56] References Cited

U.S. PATENT DOCUMENTS

| 5,481,228 | 1/1996 | Badyal | 331/74 |
|---|---|---|---|
| 5,481,563 | 1/1996 | Hamre | 375/226 |
| 5,568,819 | 10/1996 | Cooper | 331/111 |

FOREIGN PATENT DOCUMENTS 0 289 289  11/1988  European Pat. Off. .

*Primary Examiner*—Arnold Kinkead
*Attorney, Agent, or Firm*—Foley & Lardner

[57] ABSTRACT

A C-R oscillator generates a clock signal at a predetermined frequency determined by a capacitor and a resistor, and a test circuit is connected between the C-R oscillator and a pair of signal terminals for outputting the clock signal; when external control signals are supplied to the test circuit, the test circuit isolates the pair of signal terminals from the C-R oscillator, and checks the clock signal to see whether or not the duty factor of the clock signal falls within a target range so that an external testing apparatus easily diagnoses the C-R oscillator for not only the generation of the clock signal but also the duty factor.

9 Claims, 6 Drawing Sheets

OSCILLATORY CIRCUIT HAVING BUILT-IN TEST CIRCUIT FOR CHECKING OSCILLATING SIGNAL FOR DUTY FACTOR

FIELD OF THE INVENTION

This invention relates to an oscillatory circuit and, more particularly, to an oscillatory circuit having a built-in test circuit.

DESCRIPTION OF THE RELATED ART

A typical example of the C-R oscillator is illustrated in FIG. 1 of the drawings. The prior art C-R oscillator 1 is connected to an LSI (Large Scale Integration) tester, and the LSI tester is expected to diagnose the prior art C-R oscillator 1 whether to be defective or non-defective. The LSI tester has a relay unit 2 and a resistor 3 connected in series between an input node 4 and an output node 5. A control signal CTL1 is supplied to the relay unit 2, and changes the relay unit 2 between closed state and open state depending upon the potential level of the control signal CTL1. The relay unit 2 shown in FIG. 1 is in the closed state, and the prior art C-R oscillator 1 is oscillating. The prior art C-R oscillator 1 largely comprises two inverters 1a/1b, a driver 1c for the inverter 1a, a Schmitt trigger circuit 1d, a delay circuit 1e and a capacitor 1f. While the relay unit 2 is staying in the closed state, the capacitor 1f and the resistor 3 form in combination a C-R circuit, and the C-R circuit determines the oscillation frequency of a clock signal CLK1. The inverters 1a/1b supply the clock signal CLK1 at the oscillation frequency to the LSI tester. The inverter 1a is a series combination of a p-channel enhancement type field effect transistor Qp1 and an n-channel enhancement type field effect transistor Qn1, and the series combination is connected between a positive power supply line VDD and a ground line GND. The common drain node N1 is connected to the input node 4, and the driver 1c causes the p-channel enhancement type field effect transistor Qp1 and the n-channel enhancement type field effect transistor Qn1 to alternately connect the positive power supply line VDD and the ground line GND through the common drain node N1 to the input node 4.

The inverter 1b is also a series combination of a p-channel enhancement type field effect transistor Qp2 and an n-channel enhancement type field effect transistor Qn2 connected between the positive power supply line VDD and the ground line GND. The common drain node N2 is connected to the output node 5, and the Schmitt trigger circuit 1d causes the n-channel enhancement type field effect transistor Qn2 and the p-channel enhancement type field effect transistor Qp2 to alternately connect the positive power voltage line VDD and the ground line GND through the common drain node N2 to the output node 5.

The Schmitt trigger circuit 1d has an input node connected to the input node 4 and an output node connected to the driver 1c, and produces a pulse signal PLS1 from the clock signal CLK1. The Schmitt trigger circuit 1d supplies the pulse signal PLS1 to the driver 1c. The delay circuit 1e has inverters 1g/1h/1j connected in series. The output node 4 is connected to the input node of the inverter 1g, and the output node of the inverter 1j is connected to the driver 1c. The delay circuit 1e produces a delay signal DLY1 from the clock signal CLK1, and supplies it to the driver 1c.

An OR gate 1k and an AND gate 1m form in combination the driver 1c. The pulse signal PLS1 is supplied to an input node of the OR gate 1k and an input node of the AND gate 1m, and the delay signal DLY1 is supplied to the other input node of the OR gate 1k and the other input node of the AND gate 1m. The output node of the OR gate 1k is connected to the gate electrode of the p-channel enhancement type field effect transistor Qp1, and the output node of the AND gate 1m is connected to the gate electrode of the n-channel enhancement type field effect transistor Qn1.

The clock signal CLK1 is supplied from the output node 5 to a comparator (not shown) forming a part of the LSI tester. The clock signal CLK1 is periodically sampled at timing T1, T2, T3, T4, T5, T6, T7, T8 . . . (see FIG. 2), and the potential level at each sampling timing is compared with a positive high level and a ground level in the LSI tester to see whether or not the clock signal CLK1 appropriately has the high level and the low level.

Assuming now that the prior art oscillator 1 is designed to achieve the duty factor of 0.5, the LSI tester checks the potential levels at the sampling timings T1 to T8 to see whether or not the prior art C-R oscillator changes the potential level of the clock signal CLK1 from the high level to the low level or vice versa at any one of the sampling timings T1 to T8. When the clock signal CLK1 has a waveform indicated by plots C1 or C2, the duty factor is about 0.5, and the clock signal CLK1 is normal. The diagnosis is correct. If the clock signal CLK1 has a waveform indicated by plots C3 or C4, the duty factor is much smaller in value or much larger in value than 0.5, and the LSI tester has to diagnose the clock signal CLK1 to be abnormal. However, the potential level indicated by plots C3 is changed from the low level at the sampling timing T1 to the high level at the sampling timing T2, and the potential level indicated by plots C4 is changed from the high level at the sampling timing T3 to the low level at the sampling timing T4. For this reason, the LSI tester mistakenly diagnoses the clock signal CLK1 to be normal. In other words, the output signal CLK1 merely allows the LSI tester to determine whether or not the prior art C-R oscillator 1 oscillates. If the manufacturer remodels the LSI tester to check the clock signal CLK1 whether or not the prior art C-R oscillator regulates the duty factor to a target value, large amount of time and labor is consumed for the remodeling work, and is causative of increase the diagnostic cost of the prior art C-R oscillator. Thus, there is a trade-off between the reliability of the prior art C-R oscillator and the diagnostic cost thereof.

SUMMARY OF THE INVENTION

It is therefore an important object of the present invention to provide an oscillator, which internally checks an oscillation signal to see whether the duty factor falls within a target range.

In accordance with one aspect of the present invention, there is provided an oscillatory circuit for generating an oscillation signal at a predetermined frequency comprising an oscillator for supplying the oscillation signal at a first signal terminal of a signal port, and a test circuit connected between the oscillator and the signal port, and checking the oscillation signal to see whether a duty factor thereof falls within a target range.

BRIEF DESCRIPTION OF THE DRAWINGS

The features and advantages of the oscillator will be more clearly understood from the following description taken in conjunction with the accompanying drawings in which.

DESCRIPTION OF THE PREFERRED EMBODIMENT

Figure 1:
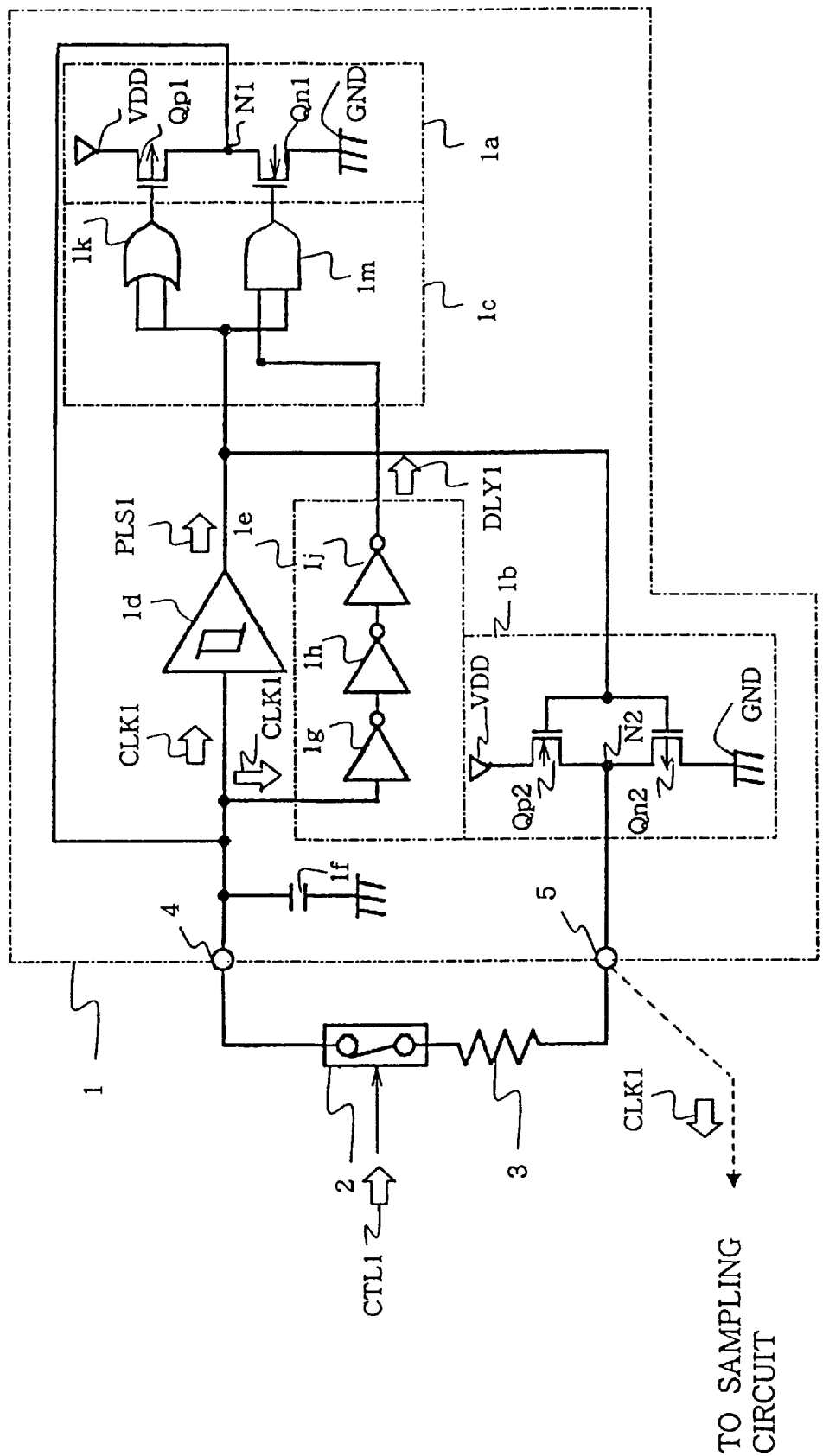
FIG. 1 is a block diagram showing the circuit configuration of the prior art C-R oscillator.
Figure 2:
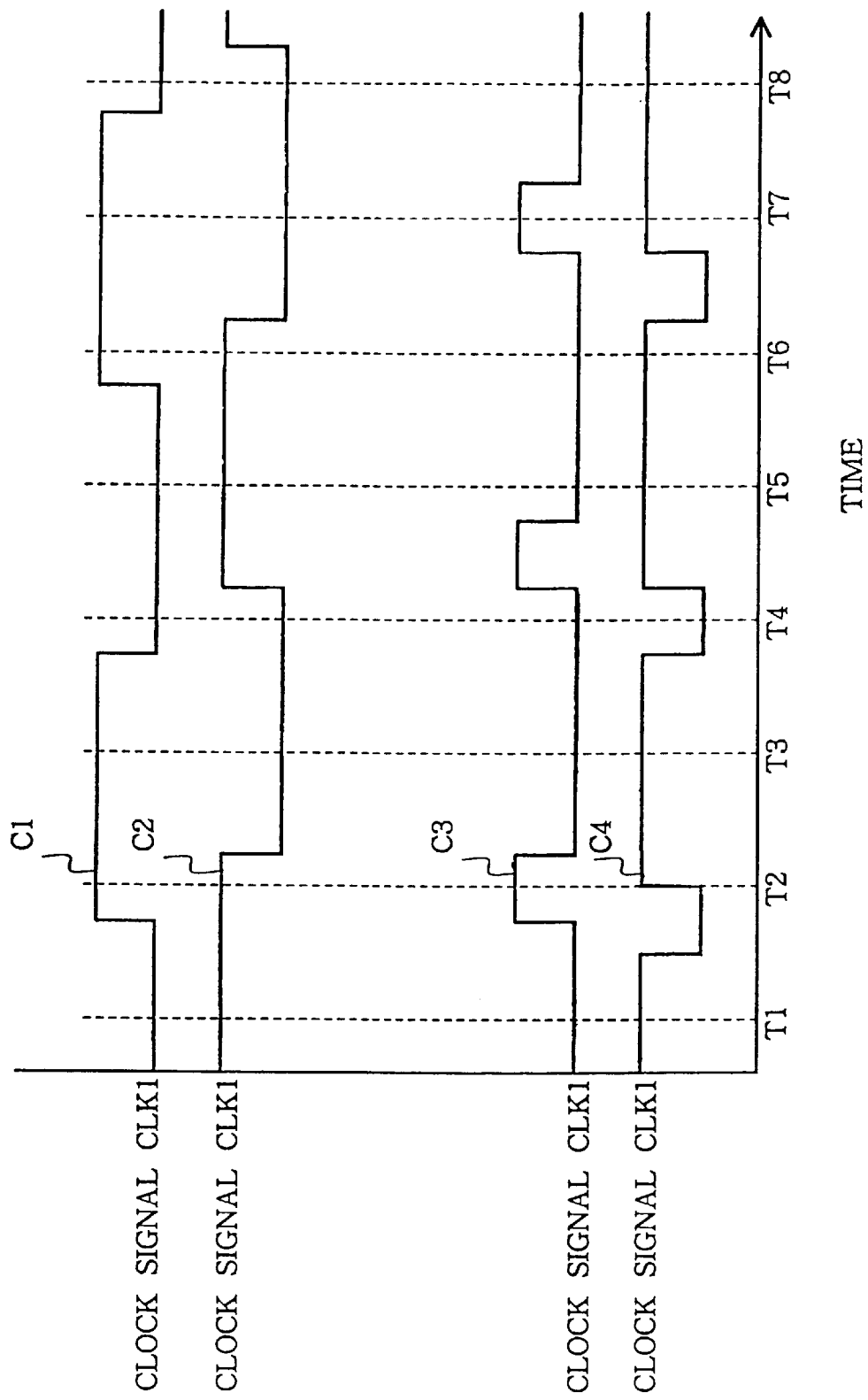
FIG. 2 is a graph showing the waveforms of the clock signal output from the prior art C-R oscillator.
Figure 3:
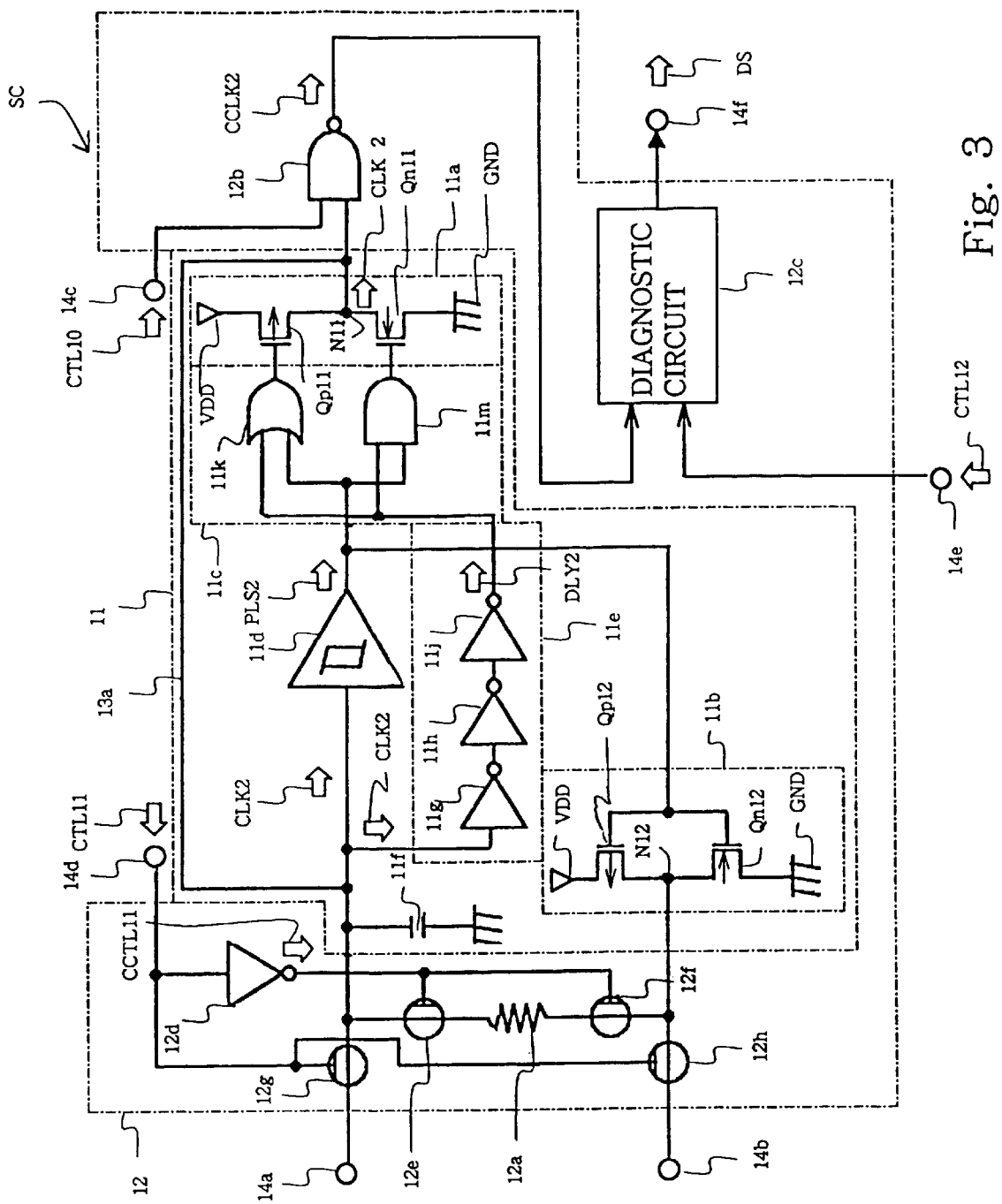
FIG. 3 is a block diagram showing the circuit configuration of an oscillatory circuit according to the present invention.

Referring to FIG. 3 of the drawings, an oscillatory circuit embodying the present invention is fabricated on a semiconductor chip SC, and largely comprises a C-R oscillator 11 and an internal test circuit 12. The C-R oscillator 11 generates a clock signal CLK2, and the internal test circuit 12 checks the clock signal CLK2 to see whether or not the pulse width falls within a target range.

The C-R oscillator 11 comprises two inverters 11a/11b, a driver 11c for the inverter 11a, a Schmitt trigger circuit 11d, a delay circuit 11e and a capacitor 11f. A resistor 12a is incorporated in the internal test circuit 12, and forms a C-R circuit together with the capacitor 11f. The C-R circuit determines an oscillation frequency of the clock signal CLK2.

The inverter 11a is a series combination of a p-channel enhancement type field effect transistor Qp11 and an n-channel enhancement type field effect transistor Qn11, and the series combination is connected between a positive power supply line VDD and a ground line GND. The common drain node N11 is connected through a signal line 13a to the Schmitt trigger circuit 11d and the delay circuit 11e. The Schmitt trigger circuit 11d, the delay circuit 11e, the driver 11c, the inverter 11a and the signal line 13a form a loop, and the clock signal CLK2 circulates through the loop. The driver 11c causes the p-channel enhancement type field effect transistor Qp11 and the n-channel enhancement type field effect transistor Qn11 to alternately connect the positive power supply line VDD and the ground line GND to the common drain node N11.

The inverter 11b is also a series combination of a p-channel enhancement type field effect transistor Qp12 and an n-channel enhancement type field effect transistor Qn12 connected between the positive power supply line VDD and the ground line GND. The Schmitt trigger circuit 11d causes the n-channel enhancement type field effect transistor Qn12 and the p-channel enhancement type field effect transistor Qp12 to alternately connect the positive power voltage line VDD and the ground line GND to the common drain node N2.

The Schmitt trigger circuit 11d has an input node connected to the signal line 13a and an output node connected to the driver 11c, and produces a pulse signal PLS2 from the clock signal CLK2. The Schmitt trigger circuit 11d supplies the pulse signal PLS2 to the driver 11c and the inverter 11b.

The delay circuit 11e has inverters 11g/11h/11j connected in series. The signal line 13a is connected to the input node of the inverter 11g, and the output node of the inverter 11j is connected to the driver 11c. The delay circuit 11e produces a delay signal DLY2 from the clock signal CLK2, and supplies it to the driver 11c.

An OR gate 11k and an AND gate 11m form in combination the driver 11c. The pulse signal PLS2 is supplied to an input node of the OR gate 11k and an input node of the AND gate 11m, and the delay signal DLY1 is supplied to the other input node of the OR gate 11k and the other input node of the AND gate 11m. The output node of the OR gate 11k is connected to the gate electrode of the p-channel enhancement type field effect transistor Qp11, and the output node of the AND gate 11m is connected to the gate electrode of the n-channel enhancement type field effect transistor Qn11.

Although the clock signal CLK2 is temporarily changed to the pulse signal PLS2 and the delay signal DLY2, the C-R oscillator 11 circulates the clock signal CLK2 through the loop, and continuously oscillates at the target frequency. The clock signal CLK2 is supplied from the C-R oscillator 11 through the internal test circuit 12 to clock signal terminals 14a/14b assigned to the clock signal CLK2.

The internal test circuit 12 comprises the resistor 12a, an NAND gate 12b, a diagnostic circuit 12c, an inverter 12d and transfer gates 12e/12f/12g/12h, and test signal terminals 14c/14d/14e/14f are assigned to an enable signal CTL10, a gate control signal CTL11, a set signal CTL12 and a diagnostic signal DS. The enable signal CTL10, the gate control signal CTL11 and the set signal CTL12 are supplied from a tester (not shown) to the test signal terminals 14c/14d/14e, respectively, and the internal test circuit 12 checks the complementary clock signal CLK2 to see whether the C-R oscillator 11 is defective or not. The internal test circuit 12 outputs a diagnostic signal DS representative of the diagnosis to the test signal terminal 14f. Thus, the oscillatory circuit has an internal test mode, and the enable signal CTL10, the gate control signal CTL11 and the set signal CTL12 cause the internal test circuit 12 to enter into the internal test mode.

The NAND gate 12b has two input nodes, and the common drain node N11 and the test signal terminal 14c are connected to the two input nodes of the NAND gate 12b. The NAND gate 12b is enabled with the enable signal CTL10 of active high level. While the NAND gate 12b is being enabled, the NAND gate 12b produces a complementary clock signal CCLK2 from the clock signal CLK2, and supplies the complementary clock signal CCLK2 to the diagnostic circuit 12c.

The inverter 12d is connected to the test signal terminal 14d, and produces a complementary gate control signal CCTL11 from the gate control signal CTL11. The transfer gates 12e and 12f are connected between the input node of the Schmitt trigger circuit 11d and the resistor 12a and between the resistor 12a and the common drain node N12, and the complementary gate control signal CCTL11 is supplied from the inverter 12d to the gate electrodes of the transfer gates 12e/12f. The other transfer gates 12g/12h are connected between the signal terminal 14a and the input node of the Schmitt trigger circuit 11d and between the signal terminal 14b and the common drain node N12, and the gate control signal CTL11 is directly supplied from the test signal terminal 14d to the gate electrodes of the transfer gates 12g/12h. For this reason, the transfer gates 12e/12f and the transfer gates 12g/12h are complementarily changed between on-state and off-state.

The gate control signal CTL11 is changed to the high level during the internal test mode, and the transfer gates 12g/12h turn off. On the other hand, the inverter 12d supplies the complementary gate control signal CCTL11 of the low level to the other transfer gates 12e/12f, and causes them to turn on. Thus, the transfer gates 12e/12f allow the resistor 12a to form the C-R circuit together with the capacitor 11f during the internal test mode, and makes the C-R oscillator 11 generate the clock signal CLK2 at the predetermined frequency. While the clock signal CLK2 is being examined, the transfer gates 12g/12h isolate the C-R oscillator 11 from the signal terminals 14a/14b. In other words, even if parasitic capacitance and/or parasitic resistance is coupled to the signal terminals 14a/14b, they do not affect the C-R circuit, and the C-R oscillator 11 keeps the clock signal CLK2 at the predetermined frequency.

On the other hand, when the enable signal CTL10, the gate control signal CTL11 and the set signal CTL12 are in the inactive level, the oscillatory circuit enters into a standard operation mode, and the clock signal CLK2 is taken out from the signal terminals 14a/14b. In detail, the C-R oscillator 11 is connected through the transfer gates 12g/12h to the signal terminals 14a/14b, and the transfer gates 12e/12f are turned off. In this situation, the capacitor 11f forms another C-R circuit together with a resistor (not shown) connected between the signal terminals 14a/14b, and the C-R oscillator 11 generates the clock signal CLK2 at a frequency determined by the C-R circuit. However, the test circuit 12 stands idle in the standard operating mode.

Figure 4:
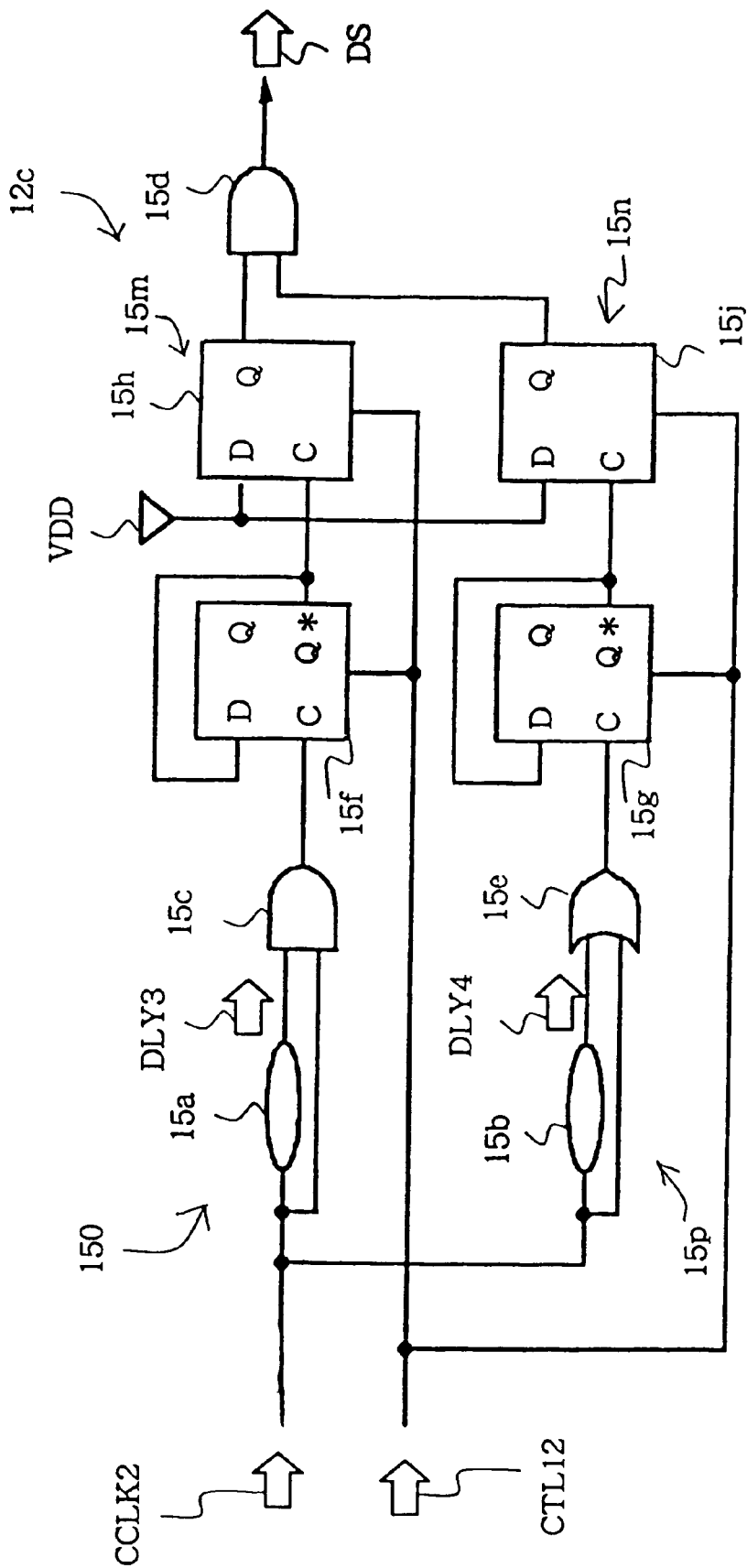
FIG. 4 is a block diagram showing the circuit configuration of a test circuit incorporated in the oscillatory circuit.

FIG. 4 illustrates the circuit configuration of the diagnostic circuit 12c. The diagnostic circuit 12c includes two delay circuits 15a/15b, AND gates 15c/15d, an OR gate 15e and delayed flip-flop circuits 15f/15g/15h/15j. The test signal terminal 14e is connected to the set nodes of the delayed flip-flop circuits 15f/15g/15h/15j, and the positive power voltage line VDD is connected to the input nodes D of the delayed flip-flop circuits 15h/15j. The clock nodes C of the delayed flip-flop circuits 15h/15j are connected to the output nodes Q* of the delayed flip-flop circuits 15f/15g, and the output nodes Q of the delayed flip-flop circuits 15h/15j are connected to the input nodes of the AND gate 15d. The output node Q* is an inverted node of the output node Q. The output node of the AND gate 15d is connected to the test signal terminal 14f. When the oscillatory circuit enters into the internal test mode, the set signal CTL12 is changed to the high level, and the delayed flip-flop circuits 15h/15j change the output nodes Q to logic "0" level. For this reason, the diagnostic signal DS is initially changed to the low level.

The output nodes of the NAND gate 12b is connected to the input nodes of the delay circuits 15a/15b, an input node of the AND gate 15c and an input node of the OR gate 15e, and the output nodes of the delay circuits 15a/15b are respectively connected to the other input node of the AND gate 15c and the other input node of the OR gate 15e. When the oscillatory circuit enters into the internal test mode, the C-R oscillator 11 starts to generate the clock signal CLK2, and the NAND gate 12b supplies the complementary clock signal CCLK2 to the delay circuits 15a/15b, the AND gate 15c and the OR gate 15e. The delay circuits 15a/15b introduce time delay Td into the propagation of the complementary clock signal CCLK2, and supply delay signals DLY3/DLY4 to the other input node of the AND gate 15c and the other input node of the OR gate 15e. The manufacturer takes a pulse width of the clock signal CLK2 under the normal oscillation into account, and determines the time delay Td to be slightly shorter than the pulse width. Therefore, the complementary clock signal CCLK2 is overlapped with the delay signal DLY3 for a short time period shorter than the pulse width of the clock signal CLK2. The complementary clock signal CCLK2 is ANDed with the delay signal DLY3, and the AND gate 15c changes the output node thereof to logic "1" level for the short time period. On the other hand, the OR gate 15e continuously changes the output node thereof to logic "1" level during a long time period from the pulse rise of the complementary clock signal CCLK2 to the pulse decay of the delay signal DLY4. The long time period is longer than the pulse width of the clock signal CLK2. The delay circuit 15a and the AND gate 15c as a whole constitute a first pulse width comparator 15o, and the first pulse width comparator 15o generates plural pulses when the clock signal CLK2 has a pulse width longer than the lower limit of the target range. On the other hand, the delay circuit 15b and the OR gate 15e form in combination a second pulse width comparator 15p, and the second pulse width comparator 15p generates plural pulses when the clock signal CLK2 has a pulse width shorter than the upper limit of the target range.

The output node of the AND gate 15c and the output node of the OR gate 15e are respectively connected to the clock nodes C of the delayed flip-flop circuits 15f/15g, and the input nodes of the delayed flip-flop circuits 15f/15g are connected to the output nodes Q* thereof. When the set signal CTL12 is changed to the high level, the delayed flip-flop circuits 15f/15g change the output nodes Q* to logic "1" level, and logic "1" level is applied to the input nodes D thereof.

The delayed flip-flop circuits 15f/15h and the delayed flip-flop circuits 15g/15j constitute counter circuits 15m/15n, and each counter 15m/15n changes the output node Q of the delayed flip-flop circuit 15h/15j to logic "1" level at the second pulse supplied from the AND gate 15c or the OR gate 15e. If the output nodes Q of the delayed flip-flop circuits 15h/15j are concurrently in logic "1" level, the AND gate 15d yields the diagnostic signal DS of the high level, which represents that the duty factor is within the target range. On the other hand, when the diagnostic signal DS is in the low level, the duty factor is either shorter or longer than the target range as will be described hereinlater.

Figure 5:
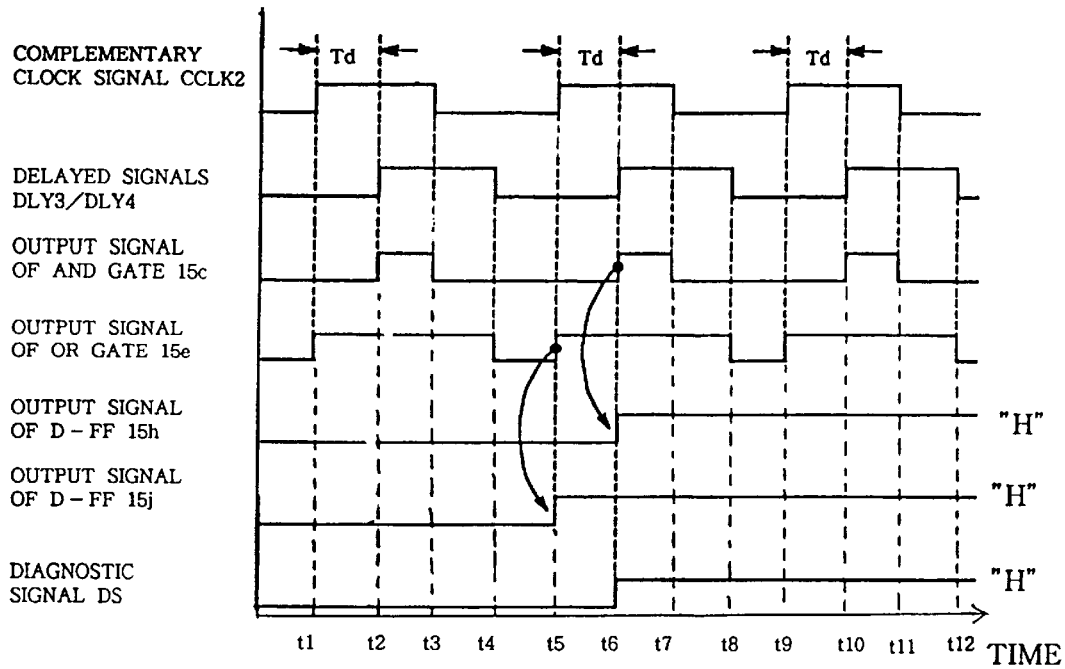
FIG. 5 is a graph showing the waveforms of essential signals when a clock signal has an appropriate pulse width.

Assuming now that the C-R oscillator 11 generates the clock signal CLK2 with a duty factor of 0.5 in the internal test mode, the NAND gate 12b changes the complementary clock signal CCLK2 to the high level at time t1, time t5, time t9, . . . (see FIG. 5), and the complementary clock signal CCLK2 falls at time t3, time t7, time t11, . . . . The delay circuits 15a/15b introduce the time delay Td into the propagation of the complementary clock signal CLK2 therethrough. The delay signals DLY3/DLY4 rise at time t2, time t6, time t10, . . . , and fall at time t4, time t8, time t12, . . .

The complementary clock signal CCLK2 is ANDed with the delay signal DLY3, and the AND gate 15c keeps the output signal thereof at the high level between time t2 and time t3 and between time t6 and time t7. On the other hand, the OR gate 15e carries out the OR operation on the complementary clock signal CLK2 and the delay signal DLY4, and keeps the output signal thereof at the high level between time t1 and time t4 and between time t5 and time t8.

When the oscillatory circuit enters into the internal test mode, the set signal CTL12 is changed to the high level, and the delayed flip-flop circuits 15f/15g and the delayed flip-flop circuits 15h/15j change the output nodes Q* to the high level and the output nodes Q to the low level, respectively. In these circumstances, although the output signal of the OR gate 15e causes the delayed flip-flop circuit 15g to change the output node Q* to the low level at time t1, the delayed flip flop circuit 15j keeps the output signal Q in the low level. Similarly, the output signal of the AND gate 15c rises at time t2, and causes the delayed flip-flop circuit 15f to change the output node Q* to the low level. However, the delayed flip flop circuit 15h keeps the output node Q in the low level.

The AND gate 15c and the OR gate 15e change the output signals to the low level at time t3 and time t4, respectively, and keeps the delayed flip-flop circuits 15f/15g/15h/15j in the previous status.

The output signal of the OR gate 15e rises at time t5, again, and causes the delayed flip-flop circuit 15g to change the output node Q* to the high level. The high level is supplied form the output node Q* of the delayed flip-flop circuit 15g to the clock node C of the delayed flip-flop circuit 15j. Then, the delayed flip-flop circuit 15j latches the high level at the input node D, and changes the output node Q to the high level.

The output signal of the AND gate 15c rises at time t6, again, and causes the delayed flip-flop circuit 15f to change the output node Q* to the high level. The high level is supplied from the output node Q* of the delayed flip-flop circuit 15f to the clock node C of the delayed flip-flop circuit 15h. The delayed flip-flop circuit 15h latches the high level at the input node D, and changes the output node Q to the high level.

Thus, both input nodes of the AND gate 15d are in the high level at time t6, and the AND gate 15d yields the diagnostic signal DS to the high level representative of that the duty factor falls within the target range.

Figure 6:
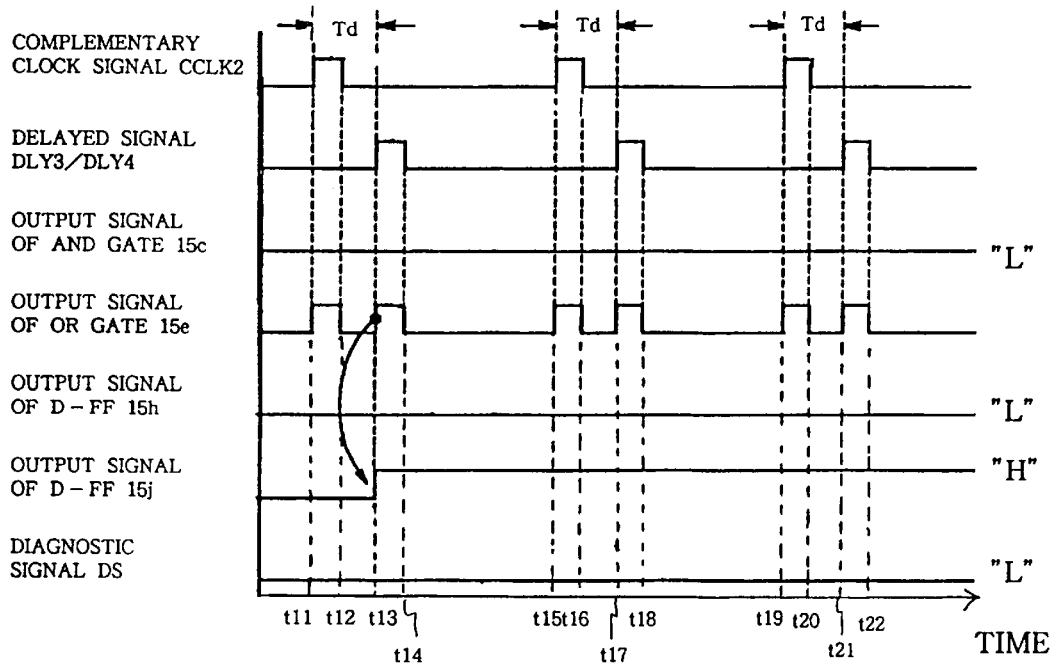
FIG. 6 is a graph showing the waveforms of the essential signals when the clock signal has a pulse with shorter than the appropriate pulse width.

If the clock signal CLK2 has a duty factor much shorter than the target range, the diagnostic circuit 12c keeps the diagnostic signal DS in the low level as shown in FIG. 6. The complementary clock signal CCLK2 is changed to the high level at time t11, time t15, time t19, . . . , and falls at time t12, time t16, time t20, . . . The pulse width is shorter than the time delay Td, and the complementary clock signal CCLK2 is never overlapped with the delay signal DLY3. The AND gate 15c keeps the output signal thereof in the low level, and, accordingly, the delayed flip-flop circuit 15h never changes the output signal thereof to the high level. On the other hand, the OR gate 15e changes the output signal thereof to the high level at the leading edge of the complementary clock signal CCLK2 and the leading edge of the delay signal DLY3. Therefore, the delayed flip-flop circuit 15g changes the output node Q* to the low level at time t11 and to the high level at time t13. The high level is supplied from the output node Q* of the delayed flip-flop circuit 15g to the clock node C of the delayed flip-flop circuit 15j, and the delayed flip-flop circuit 15j changes the output node Q to the high level at time t13. The output node Q of the delayed flip-flop circuit 15h does not allow the AND gate 15d to yield the high level. For this reason, the diagnostic signal DS is maintained in the low level representative of that the duty factor is out of the target range.

Figure 7:
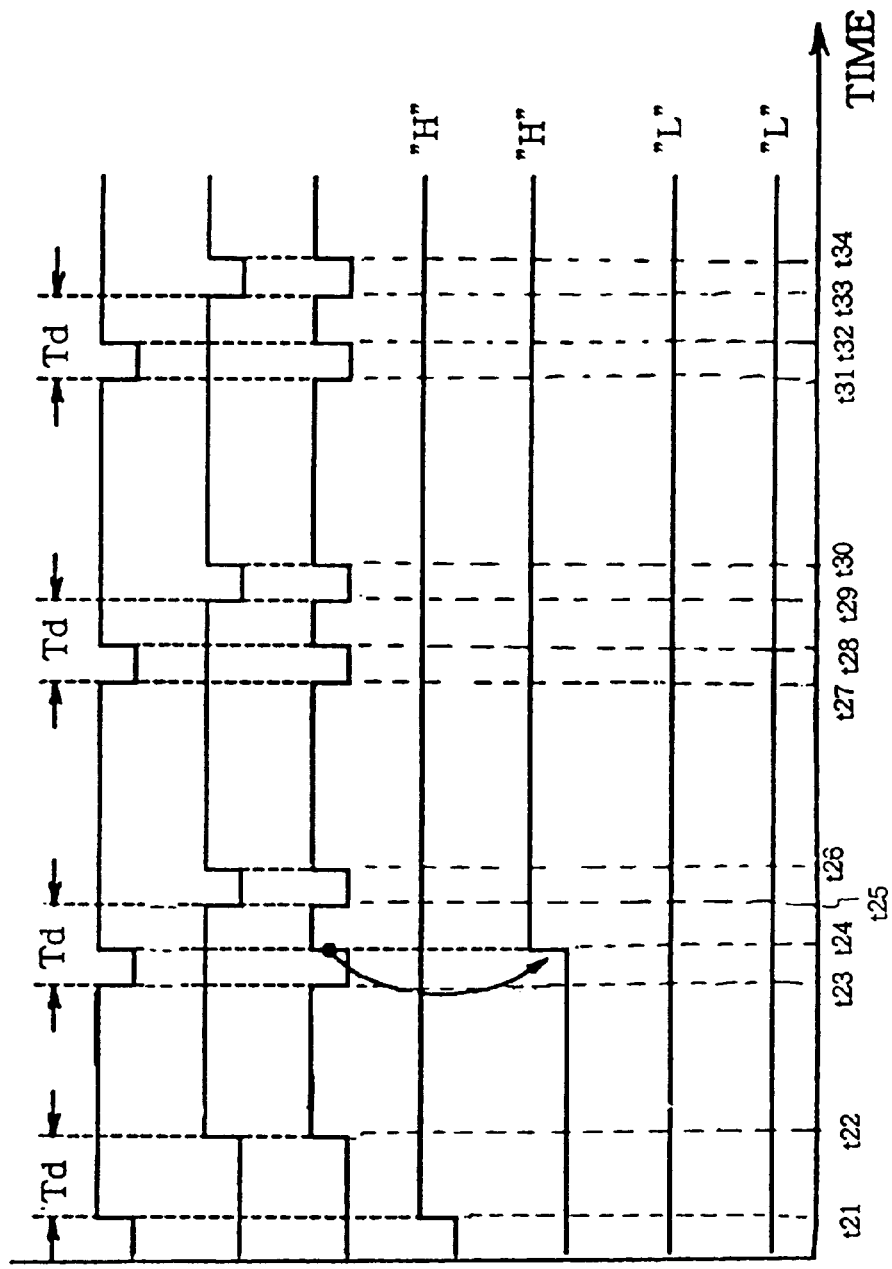
FIG. 7 is a graph showing the waveforms of the essential signals when the clock signal has a pulse with longer than the appropriate pulse width.

If the clock signal CLK2 has a duty factor longer than the target range, the diagnostic circuit 12c produces the diagnostic signal DS of the low level as shown in FIG. 7. The complementary clock signal CCLK2 is changed to the high level at time t21, time t24, time t28, time t32, . . . , and is changed to the low level at time t23, time t27, time t31, . . . The pulse width of the complementary clock signal CCLK2 is so long that one of or both of the delayed signal DLY4 and the complementary clock signal CCLK2 are in the high level during the internal test mode. For this reason, the OR gate 15e keeps the output signal at the high level from time t21, and the delayed flip-flop circuit 15j does not change the output node Q to the high level. On the other hand, the AND gate 15c produces a relatively long pulse at time t22 and a relatively short pulse at time t24. For this reason, the delayed flip-flop circuit 15g changes the output node Q* to the low level at time t22 and to the high level at time t24. The delayed flip-flop circuit 15j latches the high level at the input node D at time t24, and changes the output node Q to the high level at time t24. However, the delayed flip-flop circuit 15h does not allow the AND gate 15d to change the diagnostic signal DS to the high level, and the AND gate 15d keeps the diagnostic signal DS in the low level representative of that the duty factor is out of the target range.

When the manufacturer changes the time delay Td, the target range is also changed, and the internal test circuit 12 checks the clock signal CLK2 to see whether or not the duty factor falls within the target range. As will be appreciated from the foregoing description, the internal test circuit 12 diagnoses the C-R oscillator 11 for the duty factor, and reports the diagnosis to the tester. Thus, the oscillatory circuit according to the present invention enhances the reliability of the product without remodeling of the testing apparatus.

Although particular embodiments of the present invention have been shown and described, it will be apparent to those skilled in the art that various changes and modifications may be made without departing from the spirit and scope of the present invention.

The oscillatory circuit is not limited to the C-R oscillator. The test circuit according to the present invention may be combined with any kind of oscillation circuit.

The delay circuits 15a/15b may be a kind of variable delay circuit.

The counter 15m/15n is not limited to mod-2 counter. The counter 15m/15n may have a modulus greater than 2.

The AND gate 15d may be replaced with another logic gate such as a NAND gate or a NOR gate. In this instance, logic gate is selectively connected to the output nodes Q and Q* of the delayed flip-flop circuits 15h/15j.

What is claimed is:

1. An oscillatory circuit for generating an oscillation signal at a predetermined frequency, comprising:

an oscillator for supplying said oscillation signal at a first signal terminal of a signal port; and a test circuit connected between said oscillator and said signal port, and checking said oscillation signal to determine whether a duty factor thereof falls within a target range;

wherein said test circuit is activated in a test mode, and said oscillator and said test circuit respectively include a capacitor and a resistor for determining said predetermined frequency, and wherein said test circuit further includes a first transfer gate connected between said oscillator and said first signal terminal, a second transfer gate connected between said oscillator and said resistor and a diagnostic circuit connected to said oscillator so as to diagnose said oscillation signal whether said duty factor falls within said target range, and the first transfer gate and the second transfer gate are respectively changed to off-state and on-state in said test mode.

2. The oscillatory circuit as set forth in claim 1, in which said diagnostic circuit includes a first pulse width comparator connected to said oscillator and comparing a pulse width of said oscillation signal with a lower limit of a certain range so as to generate a plurality of first pulses when said pulse width is equal to or greater than said lower limit, a second pulse width comparator connected to said oscillator and comparing said pulse width with an upper limit of said certain range so as to generate a plurality of second pulses when said pulse width is equal to or less than said upper limit, a first counter connected to said first pulse width comparator and generating a first detecting signal when said first pulse width comparator generates said plurality of first pulses, a second counter connected to said second pulse width comparator and generating a second detecting signal when said second pulse width comparator generates said plurality of second pulses, and a logic gate connected to said first counter and said second counter and producing a diagnostic signal representative of that said pulse width falls within said target range when said first detecting signal and said second detecting signal are supplied thereto.

3. The oscillatory circuit as set forth in claim 2, in which said first pulse width comparator includes a delay circuit connected to said oscillator and introducing a time delay into propagation of said oscillation signal so as to produce a delay signal, and an AND gate connected to said oscillator and said delay circuit and producing said plurality of first pulses when a part of said oscillation signal and a part of said delay signal are concurrently maintained in logic "1" level.

4. The oscillatory circuit as set forth in claim 2, in which said second pulse width comparator includes a delay circuit connected to said oscillator and introducing a time delay into propagation of said oscillation signal so as to produce a delay signal, and an OR gate connected to said oscillator and said delay circuit and producing said plurality of second pulses when a part of said oscillation signal and a part of said delay signal are concurrently maintained in logic "0" level.

5. The oscillatory circuit as set forth in claim 3, in which said first counter includes a first delayed flip flop circuit having a clock node connected to the output node of said AND gate, an inverted output node, a non-inverted output node, a set node supplied with a set signal for changing said inverted output node to logic "1" level and an input node connected to said inverted output node, and a second delayed flip flop circuit having a clock node connected to said inverted output node of said first delayed flip flop circuit, an input node connected to a source of logic "1" level, a non-inverted output node connected to said logic gate and a set node supplied with said set signal for changing said non-inverted output node to logic "0" level.

6. The oscillatory circuit as set forth in claim 4, in which said second counter includes a first delayed flip flop circuit having a clock node connected to the output node of said OR gate, an inverted output node, a non-inverted output node, a set node supplied with a set signal for changing said inverted output node to logic "1" level and an input node connected to said inverted output node, and a second delayed flip flop circuit having a clock node connected to said inverted output node of said first delayed flip flop circuit, an input node connected to a source of logic "1" level, a non-inverted output node connected to said logic gate and a set node supplied with said set signal for changing said non-inverted output node to logic "0" level.

7. The oscillatory circuit as set forth in claim 1, in which said diagnostic circuit comprises a first pulse width comparator including a first delay circuit connected to said oscillator and introducing a first time delay into propagation of said oscillation signal so as to produce a first delay signal and an AND gate connected to said oscillator and said first delay circuit and producing at least two first pulses when a part of said oscillation signal and a part of said first delay signal are concurrently maintained in logic "1" level, a second pulse width comparator including a second delay circuit connected to said oscillator and introducing a second time delay into propagation of said oscillation signal so as to produce a second delay signal and an OR gate connected to said oscillator and said second delay circuit and producing at least two second pulses when a part of said oscillation signal and a part of said second delay signal are concurrently maintained in logic "0" level, a first counter including a first delayed flip flop circuit having a clock node connected to the output node of said AND gate, an inverted output node, a non-inverted output node, a set node supplied with a set signal for changing said inverted output node to logic "1" level and an input node connected to said inverted output node and a second delayed flip flop circuit having a clock node connected to said inverted output node of said first delayed flip flop circuit, an input node connected to a source of logic "1" level, a non-inverted output node and a set node supplied with said set signal for changing said non-inverted output node to logic "0" level, said second delayed flip flop circuit changing said non-inverted output node to logic "1" level when said at least two first pulses are supplied to said clock node of said first flip flop circuit, a second counter including a third delayed flip flop circuit having a clock node connected to the output node of said OR gate, an inverted output node, a non-inverted output node, a set node supplied with said set signal for changing said inverted output node to logic "1" level and an input node connected to said inverted output node and a fourth delayed flip flop circuit having a clock node connected to said inverted output node of said third delayed flip flop circuit, an input node connected to said source of logic "1" level, a non-inverted output node and a set node supplied with said set signal for changing said non-inverted output node to logic "0" level, said fourth delayed flip flop circuit changing said non-inverted output node to logic "1" level when said at least two second pulses are supplied to said clock node of said third delayed flip flop circuit, and an AND gate connected to said non-inverted output node of said second delayed flip flop circuit and said non-inverted output node of said fourth delayed flip flop circuit and producing a diagnostic signal representative of that said pulse width falls within said target range when said logic "1" level is supplied from said non-inverted output node of said second delayed flip flop circuit and said non-inverted output node of said fourth delayed flip flop circuit.

8. The oscillatory circuit as set forth in claim 7, in which said test circuit further includes a NAND gate having a first input node connected to said oscillator, a second input node supplied with an enable signal representative of said test mode and an output node connected to said first delay circuit, said AND gate of said first pulse width comparator, said second delay circuit and said OR gate of said second pulse width comparator.

9. An oscillatory circuit for generating an oscillation signal at a predetermined frequency, comprising:

an oscillator for supplying said oscillation signal at a first signal terminal of a signal port; and a test circuit connected between said oscillator and said signal port, and checking said oscillation signal to determine whether a duty factor thereof falls within a target range;

wherein said test circuit is activated in a test mode, and said oscillator and said test circuit respectively include a capacitor and a resistor for determining said predetermined frequency, and wherein said test circuit further includes a first transfer gate means connected between said oscillator and said first signal terminal, a second transfer gate means connected between said oscillator and said resistor and a diagnostic circuit connected to said oscillator so as to diagnose said oscillation signal whether said duty factor falls within said target range, and the first transfer gate means and the second transfer gate means are respectively changed to off-state and on-state in said test mode.

* * * * *